US012568815B2

(12) United States Patent
Nakajima

(10) Patent No.: US 12,568,815 B2
(45) Date of Patent: Mar. 3, 2026

(54) WIRINGS FOR SEMICONDUCTOR DEVICE ARRANGED AT DIFFERENT INTERVALS AND HAVING DIFFERENT WIDTHS

(71) Applicant: Kioxia Corporation, Tokyo (JP)

(72) Inventor: Akira Nakajima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 674 days.

(21) Appl. No.: 17/940,000

(22) Filed: Sep. 8, 2022

(65) Prior Publication Data

US 2023/0282577 A1 Sep. 7, 2023

(30) Foreign Application Priority Data

Mar. 2, 2022 (JP) ................................. 2022-032097

(51) Int. Cl.
H01L 23/528 (2006.01)
H01L 21/768 (2006.01)

(52) U.S. Cl.
CPC .... H01L 23/5283 (2013.01); H01L 21/76813 (2013.01); H01L 21/76816 (2013.01); H01L 21/76819 (2013.01); H01L 21/7684 (2013.01); H01L 21/76843 (2013.01); H01L 21/76895 (2013.01); H01L 23/528 (2013.01)

(58) Field of Classification Search
CPC ........... H01L 23/5283; H01L 21/76816; H01L 23/528
See application file for complete search history.

(56) References Cited

U.S. PATENT DOCUMENTS

| | | | |
|---|---|---|---|
| 6,284,666 B1 | 9/2001 | Naeem et al. | |
| 6,627,557 B2 | 9/2003 | Seta et al. | |
| 7,592,258 B2 * | 9/2009 | Lehr ................. | H01L 21/76835 |
| | | | 257/E21.585 |
| 8,247,903 B2 * | 8/2012 | Kodera ................. | H01L 23/528 |
| | | | 257/E23.145 |
| 8,330,253 B2 * | 12/2012 | Tomita .................. | H01L 23/562 |
| | | | 257/E23.022 |
| 9,728,445 B2 * | 8/2017 | Hsieh ................. | H01L 21/76816 |
| 9,929,099 B2 * | 3/2018 | Nguyen .............. | H01L 21/7682 |
| 10,233,535 B2 | 3/2019 | Kihara et al. | |
| 10,332,787 B2 * | 6/2019 | Wu .................... | H01L 21/76832 |
| 10,475,739 B2 * | 11/2019 | You ..................... | H01L 23/5226 |
| 10,535,600 B2 * | 1/2020 | Seo .................. | H01L 23/53295 |
| 10,861,705 B2 * | 12/2020 | Lin ..................... | H01L 21/0337 |
| 11,094,586 B2 * | 8/2021 | Choi .................. | H01L 21/7684 |

(Continued)

FOREIGN PATENT DOCUMENTS

| | | |
|---|---|---|
| JP | H0362519 A | 3/1991 |
| JP | 2002033313 A | 1/2002 |

(Continued)

*Primary Examiner* — Daniel Luke
(74) *Attorney, Agent, or Firm* — Holtz, Holtz & Volek PC

(57) ABSTRACT

A semiconductor device according to the present embodiment includes a wiring layer including a plurality of wires. The wires include first wires and second wires. Each of the first wires has a first width in a direction substantially parallel to the wiring layer. The second wires are arranged at wider intervals than intervals of the first wires. Each of the second wires includes a first wiring member having a second width larger than the first width, and a second wiring member provided on the first wiring member and having a third width larger than the second width.

5 Claims, 17 Drawing Sheets

(56) References Cited

U.S. PATENT DOCUMENTS

| | | | | |
|---|---|---|---|---|
| 11,923,246 | B2* | 3/2024 | Motoyama .......... | H01L 23/5283 |
| 2015/0137388 | A1* | 5/2015 | Kim ..................... | H01L 23/481 |
| | | | | 257/774 |
| 2018/0082890 | A1* | 3/2018 | Cho ..................... | H10D 84/038 |
| 2021/0159163 | A1* | 5/2021 | Liff ...................... | H01L 21/768 |
| 2023/0335390 | A1* | 10/2023 | Chen ................. | H01L 21/30604 |

FOREIGN PATENT DOCUMENTS

| | | | |
|---|---|---|---|
| JP | 2016032028 | A | 3/2016 |
| TW | 536749 | B | 6/2003 |

\* cited by examiner

WIRINGS FOR SEMICONDUCTOR DEVICE ARRANGED AT DIFFERENT INTERVALS AND HAVING DIFFERENT WIDTHS

CROSS REFERENCE TO RELATED APPLICATIONS

This application is based upon and claims the benefit of priority from the prior Japanese Patent Application No. 2022-032097, filed on Mar. 2, 2022, the entire contents of which are incorporated herein by reference.

FIELD

The embodiments of the present invention relate to a semiconductor device and a manufacturing method thereof.

BACKGROUND

In order to secure planarization of CMP (chemical mechanical polishing), embedding in a pattern with a higher aspect ratio than an aspect ratio of a wire that is actually formed might be required. However, the higher the aspect ratio, the more difficult the embedding, and this might hinder appropriate embedding.

DETAILED DESCRIPTION

Figure 1:
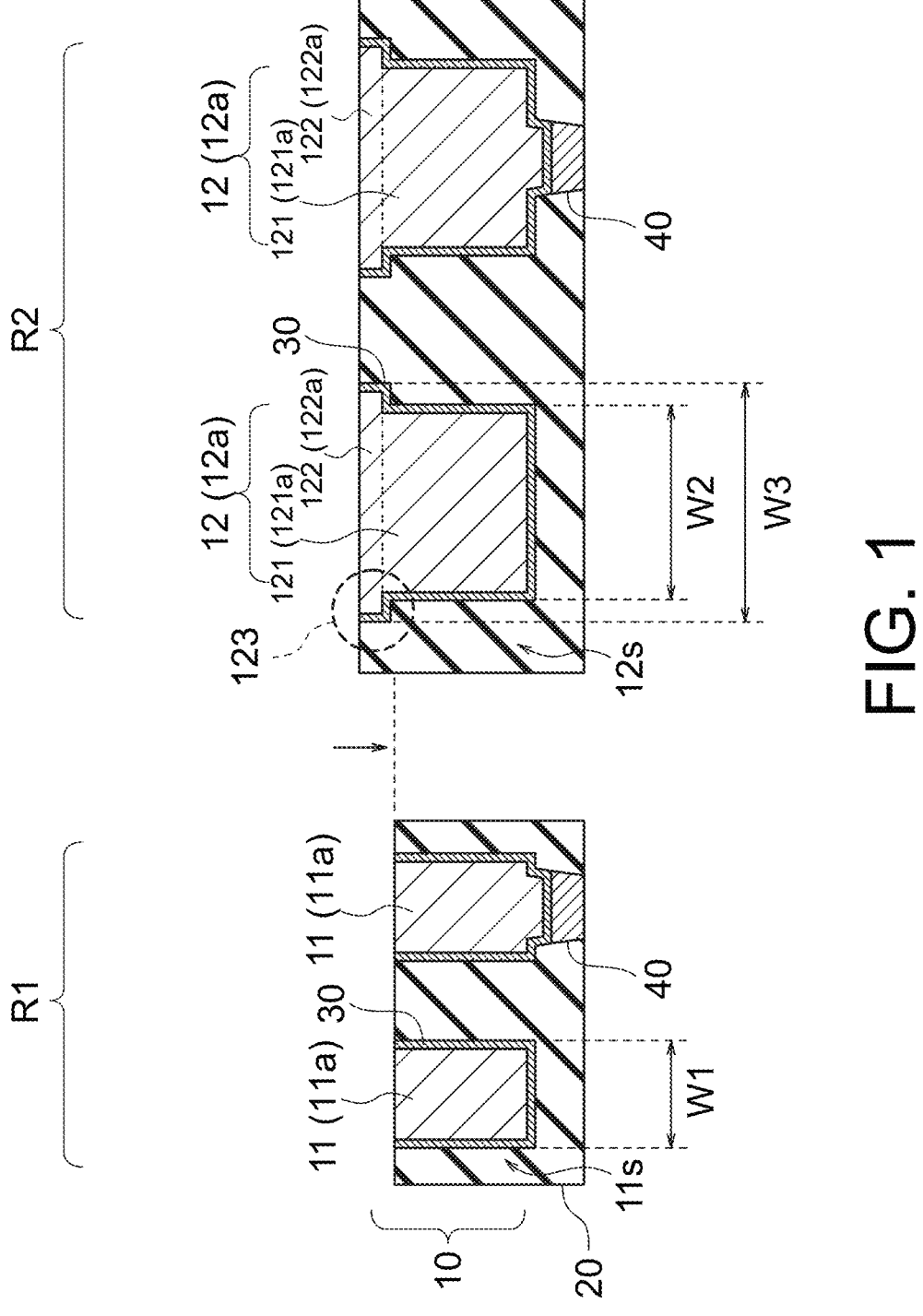
FIG. 1 is a cross-sectional view showing an example of a configuration of a semiconductor device according to the first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a wiring layer including a plurality of wires. The wires include first wires and second wires. Each of the first wires has a first width in a direction substantially parallel to the wiring layer. The second wires are arranged at wider intervals than intervals of the first wires. Each of the second wires includes a first wiring member having a second width larger than the first width and a second wiring member provided on the first wiring member and having a third width larger than the second width.

First Embodiment

FIG. 1 is a cross-sectional view showing an example of the configuration of the semiconductor device according to the first embodiment. FIG. 1 shows a wiring layer 10 used for the semiconductor device.

The semiconductor device includes the wiring layer 10, an insulator layer 20, a barrier metal film 30, and columnar electrodes (via-plugs) 40.

The wiring layer 10 includes a plurality of wires in this layer. When the semiconductor device is a memory (memory cells), the wiring layer 10 includes, for example, wires for a memory cell array, wires for peripheral circuits such as electric circuits, and the like. In the following description, the case where the semiconductor device is a memory will be described; however, the present invention is not limited to this, and the semiconductor device may be a logic circuit (a logic element) or the like.

The plurality of wires in the wiring layer 10 include the wires 11 and the wires 12.

The wires 11 are arranged with a dense pitch in a region R1. The wires 11 are arranged in a line and space pattern, for example. The wires 11 extend in a direction perpendicular to the sheet of FIG. 1. The wires 11 are used, for example, for bit lines of a memory.

The wires 11 each have a width W1 in a direction substantially parallel to the wiring layer 10. More specifically, the width W1 is a width substantially parallel to the wiring layer 10 and substantially perpendicular to the direction in which the wire 11 extends.

The wires 12 are arranged with a coarse pitch in a region R2 different from the region R1. That is, the wires 12 are arranged at larger intervals than the intervals of the wires 11. The wires 12 may be arranged in a line and space pattern. The height of the wire 12 is higher than the height of the wire 11. The height of the wire is a height in a direction substantially perpendicular to the wiring layer 10, that is, a height in the upward-downward direction of the sheet of FIG. 1.

Each of the wires 12 includes wiring members 121, 122.

The wiring member 121 has a width W2 larger than the width W1. The width W1 is approximately 20 nm, for example, but is not limited to this. The width W2 is approximately 1 μm, for example, but is not limited to this.

The wiring members 122 are provided on the wiring members 121. Each wiring member 122 is provided integrally with each wiring member 121. In the following description, the upward direction is the upward direction of the sheet of FIG. 1. Each wiring member 122 has a width W3 larger than the width W2.

A side surface 12s of the wire 12 in a direction substantially perpendicular to the wiring layer 10 is provided with a step 123 at a boundary between the wiring member 121 and the wiring member 122, the step 123 being defined in accordance with a difference between the width W2 and the width W3. That is, the width of the wire 12 changes discontinuously from an upper end portion to a lower end portion of the wire 12. The width of the step 123 is approximately 10 nm, for example, but is not limited to this. As will be described later with reference to FIG. 2A to FIG. 2D and FIG. 3, the step 123 of the wire 12 is formed by embedding an electrically conductive material 50 in a recess having a step on the side wall.

A side surface 11s of the wire 11 in a direction substantially perpendicular to the wiring layer 10 has no step. The side surface 11s has a tapered shape that narrows from an upper end portion to a lower end portion of the wire 11, for example. That is, the width of the wire 11 continuously changes from the upper end portion to the lower end portion of the wire 11.

The height of the wire 11 in the direction substantially perpendicular to the wiring layer 10 is lower than the height of the wiring member 121 (the wire 12). As will be described later, this is because, for example, there is a difference in depth of polishing (e.g., CMP (chemical mechanical polishing)) depending on the difference between the wires 11 with a dense pitch and the wires 12 with a coarse pitch.

As a material of the wires 11, 12, electrically conductive materials such as Cu may be used, for example.

The insulator layer 20 insulates between the wires. For example, $SiO_2$ is used as the material of the insulator layer 20. The insulator layer 20 is formed using TEOS (tetra-ethoxysilane) or the like, for example.

The barrier metal film 30 suppresses diffusion of Cu contained in the material of the wires 11, 12. The barrier metal film 30 is provided between the wires (wires 11, 12) and the insulator layer 20. The barrier metal film 30 is provided between the wires (wires 11, 12) and the columnar electrodes 40. For the barrier metal film 30, titanium (Ti), Ta (tantalum), tantalum nitride film (TaN), or the like may be used, for example.

The columnar electrodes 40 electrically connect the wires 11 or the wires 12 with lower-layer wires (not shown). The columnar electrodes 40 are electrically connected to bottoms of the wires 11 or the wires 12. Each columnar electrode 40 extends in a direction substantially perpendicular to the wiring layer 10. Further, the bottom of the wire 11 or the wire 12 in contact with the columnar electrode 40 protrude toward the columnar electrode 40. As the material of the columnar electrodes 40, for example, an electrically conductive material such as tungsten (W) or the like may be used.

The difference in height between the wire 11 and the wire 12 will be described, hereinafter.

Dishing might be caused during the polishing (e.g., CMP) of forming the wires 11, 12. The size of dishing varies depending on, for example, the densities and the widths among the wires. In the example shown in FIG. 1, the wires 11 with a dense pitch are polished deeper than the wires 12 with a coarse pitch. Therefore, the height of an upper end surface of each wire 11 is lower than the height of an upper end surface of each wire 12.

As will be described later with reference to FIG. 3, since the wires 12 are polished shallower than the wire 11, the wires 12 each has the wiring member 122. That is, the step on the side surface 11s of each wire 11 is removed, and the step 123 on the side surface 12s of each wire 12 remains.

Usually, in order to secure planarization of the CMP, that is, to reduce a difference between the upper end surfaces of the wires 11 and 12, an electrically conductive material is embedded in the pattern having relatively deep recesses, and the polishing amount of the CMP is set to be larger. However, this requires embedding in a pattern having a high aspect ratio, which requires an excessive embedding technology.

To cope with this, recesses are formed in the insulator layer 20 so as to increase an opening at the top of the pattern such that the embedding in the pattern with a high aspect ratio can be performed more appropriately.

Now, the embedding flow will be described, hereinafter.

FIG. 2A to FIG. 2D are cross-sectional views each showing an example of the manufacturing method of the semiconductor device according to the first embodiment. FIG. 2A to FIG. 2D each show a method of forming the wires 11 with a dense pitch arranged in the region R1, but the same applies to a method of forming the wires 12 with a coarse pitch arranged in the region R2. Details of the manufacturing method up to FIG. 2A will be described later with reference to FIG. 4A to FIG. 4E.

Figure 2A:
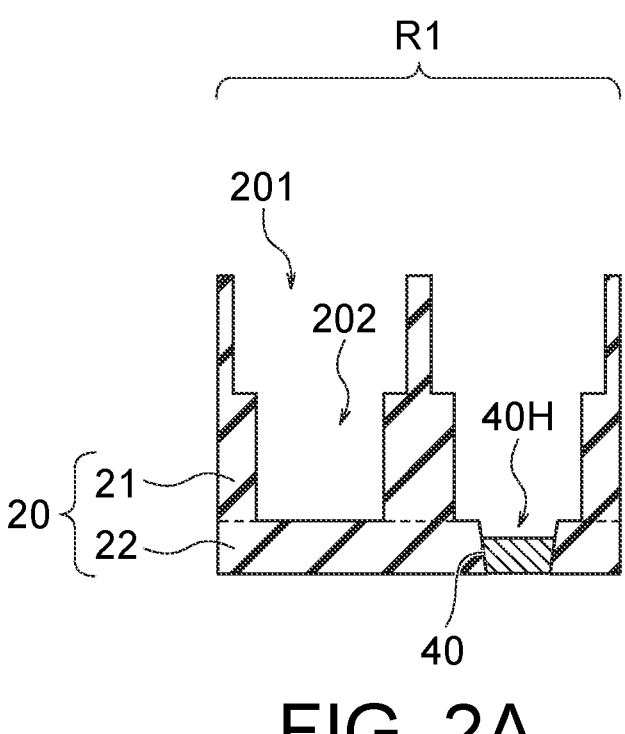
FIG. 2A is a cross-sectional view showing an example of a manufacturing method of the semiconductor device according to the first embodiment.

As shown in FIG. 2A, the insulator layer 20 includes an insulator layer 21 and an insulator layer 22. The insulator layer 22 is an insulator layer provided with a hole 40H and the columnar electrode 40. Further, the insulator layer 21 is an insulator layer provided on the insulator layer 22. The insulator layers 21, 22 are formed by using TEOS or the like, for example.

First, as shown in FIG. 2A, a recess 201 and a recess 202 are formed in the insulator layer 21. The columnar electrode 40 is provided in the hole 40H. As will be described later with reference to FIG. 4E, the columnar electrode 40 is partially removed (recessed) such that the top of the hole 40H is exposed to the bottom of the recess 202.

The recess 201 is provided to an upper portion of the insulator layer 21. The recess 201 is provided so as to be recessed from the upper surface of the insulator layer 21 to a depth in the middle of the insulator layer 21. In the example shown in FIG. 2A, the recess 201 is formed to half the depth of the insulator layer 21.

The recess 202 is provided to the bottom of the recess 201. The recess 202 has a width smaller than the width of recess 201. The recess 202 is formed to have a width equal to the width of the wire 11.

Figure 2B:
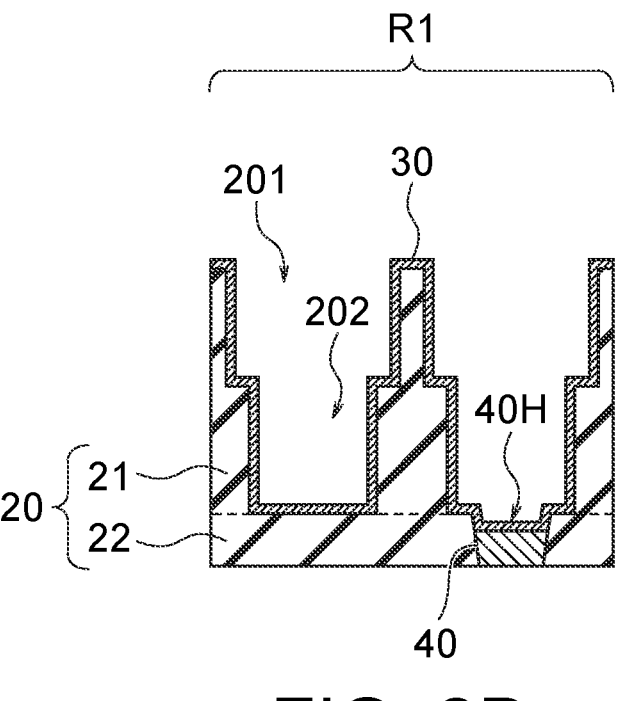
FIG. 2B is a cross-sectional view showing the example of the manufacturing method of the semiconductor device, following FIG. 2A.

First, as shown in FIG. 2B, the barrier metal film 30 is formed on the insulator layer 20 and in the recess 201 and the recess 202.

Figure 2C:
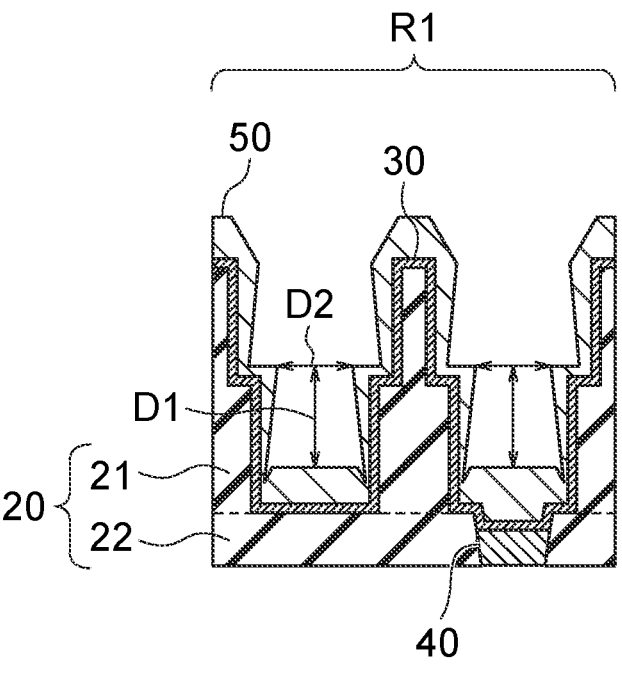
FIG. 2C is a cross-sectional view showing the example of the manufacturing method of the semiconductor device, following FIG. 2B.

Then, as shown in FIG. 2C, a seed layer of the electrically conductive material 50 is formed inside the recess 201 and the recess 202. The seed layer is formed by sputtering, for example. In the example shown in FIG. 2C, the upper surface of the electrically conductive material 50 has the same height regardless of the presence or absence of the columnar electrode 40; however, this height may be different. The electrically conductive material 50 is Cu, for example.

In a PVD (physical vapor deposition) method such as spattering, the electrically conductive material 50 is not usually uniformly (conformally) deposited. The seed layer of the electrically conductive material 50 tends to be formed thicker at the opening portion of the recess 202.

A distance D1 is a distance from the upper surface of the electrically conductive material 50 formed on the bottom of the recess 202 to the opening portion of the recess 202 (bottom-up distance). A distance D2 is a distance of the electrically conductive material 50, which is formed at the opening portion of the recess 202, across this opening. As the recess 201 having a width larger than that of the recess 202 is provided on the recess 202, the distance D1 becomes smaller. This allows sputtered particles to easily enter the insides of the recess 201 and the recess 202. By providing the recess 201, the distance D1 can be set smaller than the distance D2. That is, the opening relative to the depth of the pattern can be wider. Accordingly, formation of voids or the like in the wires can be suppressed, thereby performing the embedding more appropriately.

6

Figure 2D:
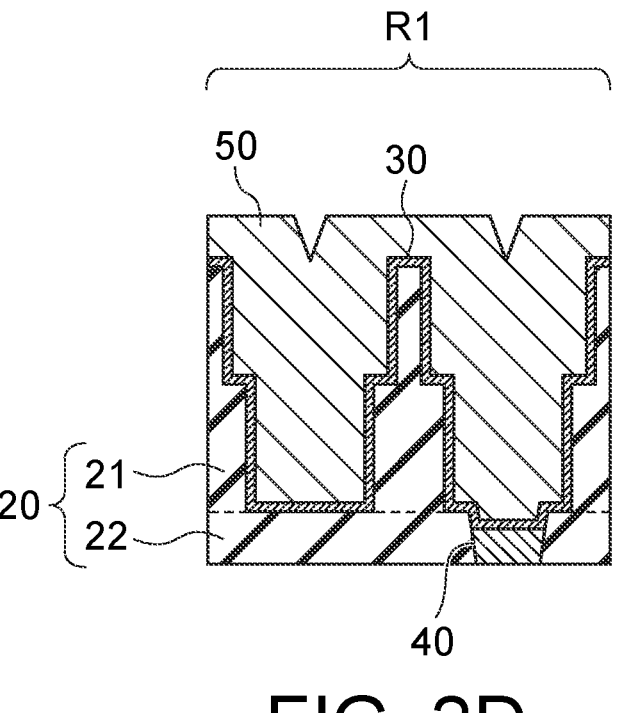
FIG. 2D is a cross-sectional view showing the example of the manufacturing method of the semiconductor device, following FIG. 2C.

Next, as shown in FIG. 2D, the electrically conductive material 50 is formed in the insides of the recess 201 and the recess 202 to embed the electrically conductive material 50 in the recess 201 and the recess 202. The electrically conductive material 50 is formed by plating, for example. The wiring member 121 is formed in the recess 201, and the wiring member 122 is formed in the recess 202. Subsequently, the insulator layer 21 and the electrically conductive material 50 are polished by CMP or the like, thereby forming the wire 11.

Figure 3:
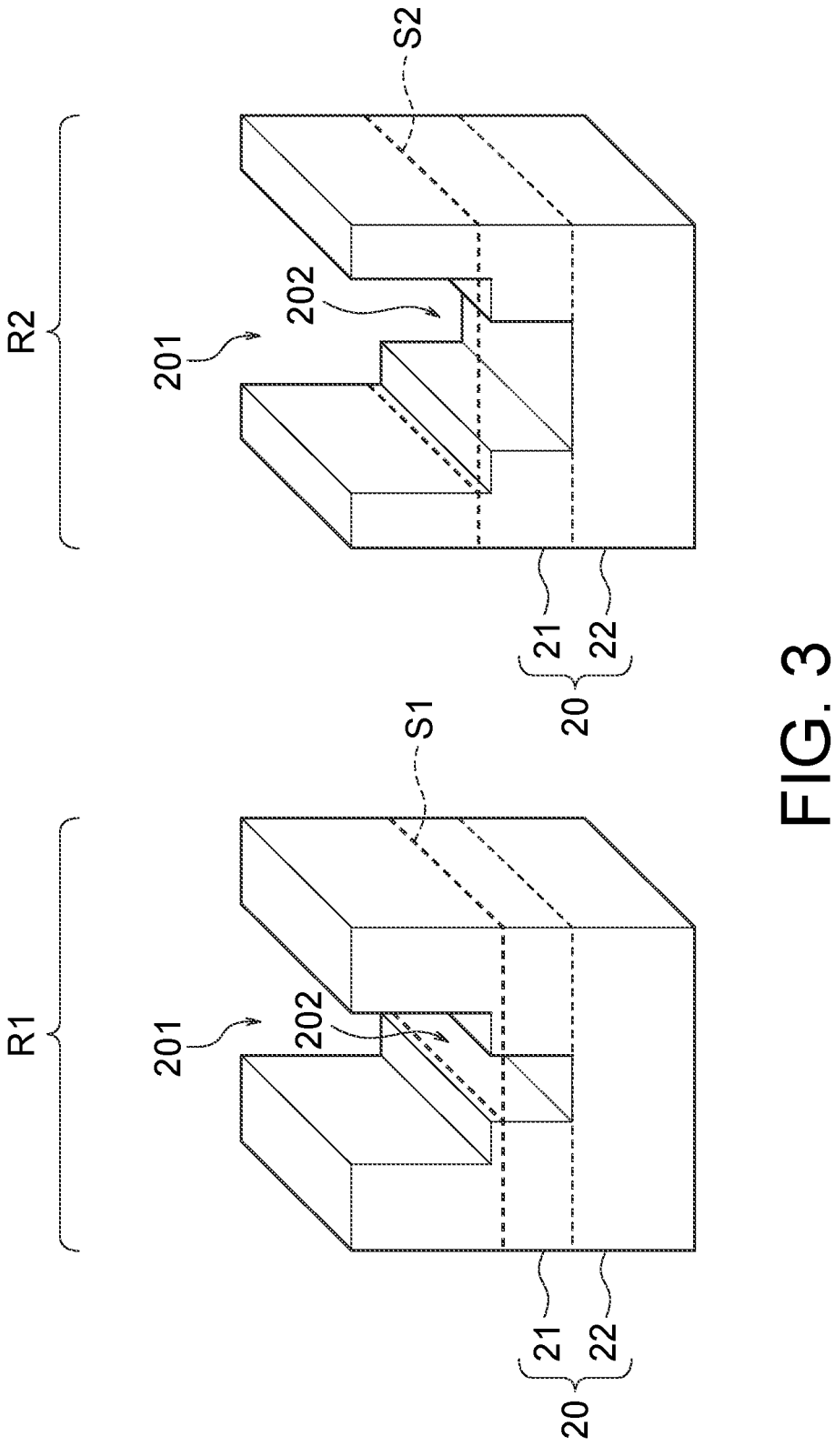
FIG. 3 is a perspective view showing an example of polishing positions according to the first embodiment.

FIG. 3 is a perspective view showing an example of the polishing positions according to the first embodiment. FIG. 3 shows the insulator layer 20 formed with the recess 201 and the recess 202. It should be notated that the illustration of the hole 40H, which is exposed by partially removing the columnar electrode 40, is omitted. The left side of FIG. 3 shows a polished surface S1 in the region R1. The right side of FIG. 3 shows a polished surface S2 in the region R2. The positions (heights) of the polished surfaces S1, S2 differ depending on, for example, the widths of the recesses 201, 202 due to the dishing.

As shown in FIG. 3, in the region R1, the polished surface S1 is located deeper than the recess 201 and crosses the recess 202. Therefore, in the region R1, the wiring member formed in the recess 201 is completely removed by polishing, and the wiring member formed in the recess 202 remain as the wire 11. On the other hand, in the region R2, the polished surface S2 crosses the recess 201. Therefore, in the region R2, as the wire 12, the wiring member 121 and a part of the wiring member 122 formed in the recess 201 remains, as shown in FIG. 1.

In the process of forming the recesses 201, 202 shown in FIG. 2A, as shown in FIG. 3, the recesses 201, 202 are formed such that the width of recess 202 on the insulator layer 21 in the region R1 becomes smaller than the width of the recess 202 in the region R2. The region R2 is a different region from the region R1.

In the polishing process following the process shown in FIG. 2D, the insulator layer 21 and the electrically conductive material 50 are polished such that the electrically conductive material 50 in the recess 201 in the region R1 is removed, as shown in FIG. 3. In addition, the insulator layer 21 and the electrically conductive material 50 are polished such that at least a part of the electrically conductive material 50 in the recess 201 in the region R2 remains.

Now, the manufacturing flow of forming the recesses 201, 202 will be described, hereinafter.

FIG. 4A to FIG. 4E are cross-sectional views each showing an example of the manufacturing method of the semiconductor device according to the first embodiment. FIG. 4A to FIG. 4E each show a method of forming the wires 11 with a dense pitch arranged in the region R1, and the same applies to a method of forming the wires 12 with a coarse pitch arranged in the region R2.

As shown in FIG. 2A, the insulator layer 22 is provided with the columnar electrode 40. First, the insulator layer 22 is formed, the hole 40H is formed in the insulator layer 22, and then the columnar electrode 40 is formed in the hole 40H. In this manner, in the insulator layer 22, the columnar electrode 40 is formed that extends in the direction substantially perpendicular to the insulator layer 21 and through the insulator layer 22. As the material of the columnar electrode 40, for example, an electrically conductive material such as tungsten may be used. Subsequently, the insulator layer 21 is formed on the insulator layer 22.

Figure 4A:
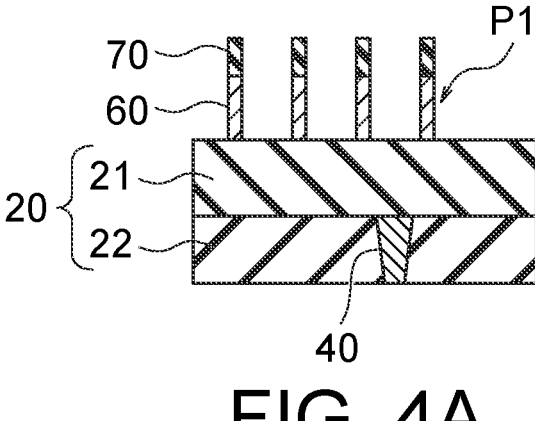
FIG. 4A is a cross-sectional view showing an example of the manufacturing method of the semiconductor device according to the first embodiment.

First, as shown in FIG. 4A, a mask material 60 in a pattern P1 is formed on the insulator layer 20. For example, the mask material 60 is formed on the insulator layer 21, a mask material 70 in the pattern P1 is formed on the mask material 60, and then the mask material 60 is processed by using the mask material 70 as a mask. In this manner, the pattern P1 can be formed in the mask material 60. Each interval of the mask material 60 in the pattern P1 corresponds to the width of each recess 201. The mask materials 60, 70 are processed by RIE (reactive ion etching), for example.

For example, tungsten may be used as the material of the mask material 60. For example, $SiO_2$ may be used as the material of the mask material 70.

Figure 4B:
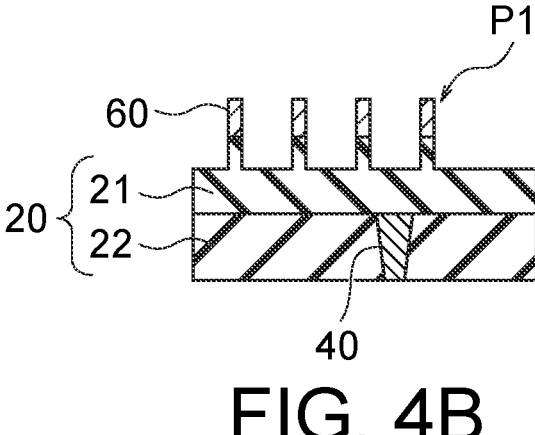
FIG. 4B is a cross-sectional view showing the example of the manufacturing method of the semiconductor device, following FIG. 4A.

Next, as shown in FIG. 4B, the upper portion of the insulator layer 21 is processed by using the mask material 60 in the pattern P1 as a mask. That is, the insulator layer 21 is processed halfway. The insulator layer 21 is processed by RIE, for example.

Figure 4C:
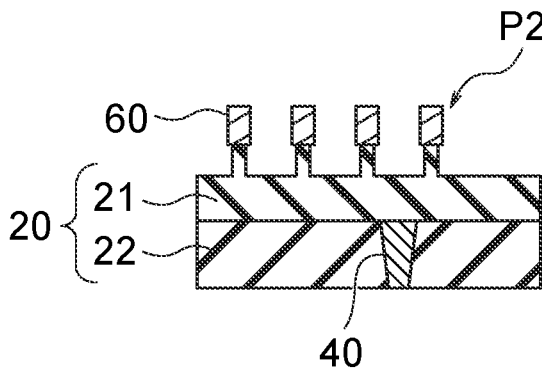
FIG. 4C is a cross-sectional view showing the example of the manufacturing method of the semiconductor device, following FIG. 4B.

As shown in FIG. 4C, the mask material 60 is selectively regrown. That is, the width of the mask material 60 in the direction substantially parallel to the insulator layer 21 is changed such that the pattern of the mask material 60 becomes a pattern P2 different from the pattern P1. More specifically, the mask material 60 is selectively grown so as to increase the width of the mask material 60. Each interval of the mask material 60 in the pattern P2 corresponds to the width of each recess 202.

Figure 4D:
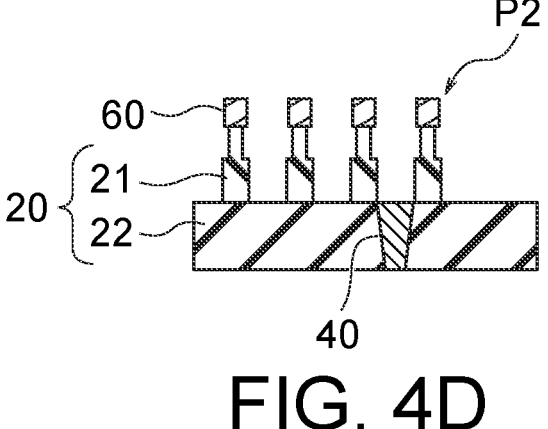
FIG. 4D is a cross-sectional view showing the example of the manufacturing method of the semiconductor device, following FIG. 4C.

Next, as shown in FIG. 4D, the recesses 201, 202 are formed in the insulator layer 21 by processing the insulator layer 21 using the mask material 60 in the pattern P2 as a mask. More specifically, the recesses 201, 202 are formed in such a manner that the upper end portion of the columnar electrode 40 is exposed. The insulator layer 21 is processed by RIE, for example.

Figure 4E:
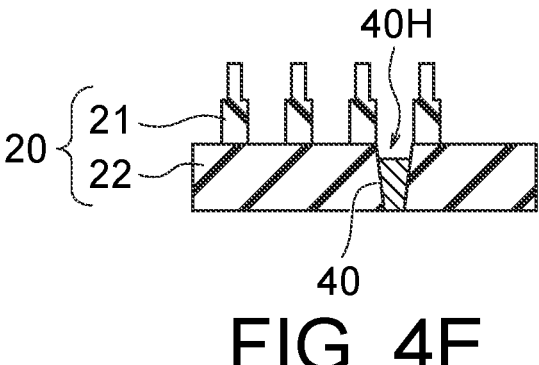
FIG. 4E is a cross-sectional view showing the example of the manufacturing method of the semiconductor device, following FIG. 4D.

As shown in FIG. 4E, the mask material 60 is removed, and a part of the columnar electrode 40 is also removed. As a result, the upper end portion of the columnar electrode 40 is dented (recessed) such that the upper portion of the hole 40H opens. When the material of the mask material 60 is tungsten, the removal of the mask material 60 is carried out, for example, by wet-etching using a mixed solution of TMY (trimethyl-2 hydroxyethylammonium hydroxide) and $H_2O_2$ (hydrogen peroxide solution). Since the same material as the mask material 60 is used for the columnar electrode 40, the columnar electrode 40 is partially removed. The process shown in FIG. 4E corresponds to FIG. 2A. Subsequently, the processes shown in FIG. 2B to FIG. 2D are performed.

As described above, according to the first embodiment, the insulator layer 21 is processed such that the width of the mask material 60 is changed during the processing of the insulator layer 21. Accordingly, it is possible to form the recess 201 having a larger width than the width of the recess 202. The recess 201 thus configured allows the top of the pattern to have a larger width and thereby difficulty in embedding can be reduced.

Further, increase in width of the mask material 60 is realized by the regrowth of the mask material 60. Accordingly, the recesses 201, 202 can be formed without an additional lithography process.

Further, in the process shown in FIG. 4C, the width of the mask material 60 in the region R1 becomes increased, and at the same time, the width of the mask material 60 in the region R2 also becomes increased. Therefore, the recess 201 having a larger width than the width of the recess 202 is formed also in the region R2. Since the recesses 202 in the region R2 each have a larger width than that of each of the recesses 202 in the region R1, the embedding can be easily carried out.

Due to dishing, the polishing depth varies between the wires 11 with a dense pitch in the region R1 and the wires 12 with a coarse pitch in the region R2. In the wires 11 with a dense pitch, the recesses 201 are parts to be polished by CMP. In the wires 12 with a coarse pitch, the recesses 201 are not completely polished by CMP. Therefore, each wire 12 includes the wiring member 121 and the wiring member 122 that have different widths from each other. Further, the side surface 12s of the wire 12 has a step.

In the region R1, since the intervals of the wires 11 are relatively narrow, the wiring member in the recess 201 having a large width might lead to a leak or a short circuit. Therefore, it is preferable that the wiring member formed in the recess 201 in the region R1 is completely removed as shown in FIG. 1. On the other hand, since the intervals of the wires 12 are relatively wide in the region R2, the wiring member 122 is unlikely to lead to a leak or a short circuit. Therefore, disadvantageous effects caused by remaining the wiring members 122 of the wires 12 are small.

As shown in FIG. 1, the bottom of the wire 11 or the wire 12 in contact with the columnar electrode 40 protrudes toward the columnar electrode 40. Therefore, the height of the connecting surface between the wire 11 or the wire 12 and the columnar electrode 40 is lower than the height of the bottom of the wire 11 or the wire 12 that is out of contact with the columnar electrode 40. The height is a height in a direction substantially perpendicular to the wiring layer 10. That is, a gap is generated between the height of the upper end portion of the columnar electrode 40 and the height of the surface of the bottom of the corresponding wire 11 or 12 (boundary surface between the insulator layer 21 and the insulator layer 22). Accordingly, stress is less likely to be applied to the connecting surface between the wire 11 or the wire 12 and the columnar electrode 40, thereby improving the connection reliability.

The material of the mask material 60 may be any material as far as the material can be selectively regrown. The material of the mask material 60 is not limited to tungsten, and may be titanium (Ti) or the like, for example.

Comparative Example

As a comparative example, the case where no recess 201 is formed will be described, hereinafter.

Figure 5:
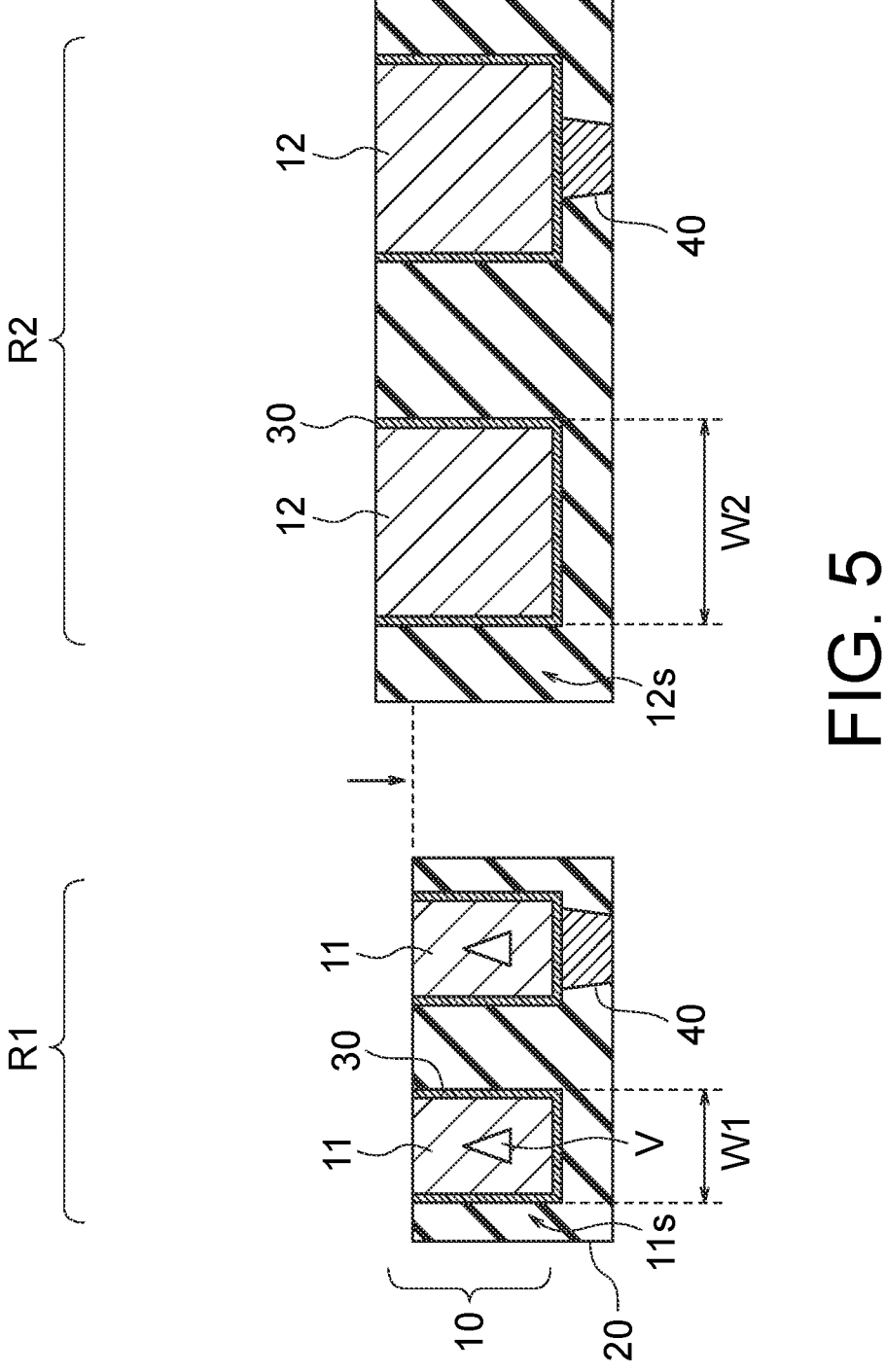
FIG. 5 is a cross-sectional view showing an example of a configuration of a semiconductor device according to a comparative example.

FIG. 5 is a cross-sectional view showing an example of the configuration of a semiconductor device according to the comparative example.

In the example shown in FIG. 5, the side surface 12s of each wire 12 is provided with no step. Further, in the example shown in FIG. 5, the columnar electrode 40 is not recessed.

Now, a flow of the embedding will be described, hereinafter.

FIG. 6A to FIG. 6D are cross-sectional views each showing an example of the manufacturing method of the semiconductor device according to the comparative example.

Figure 6A:
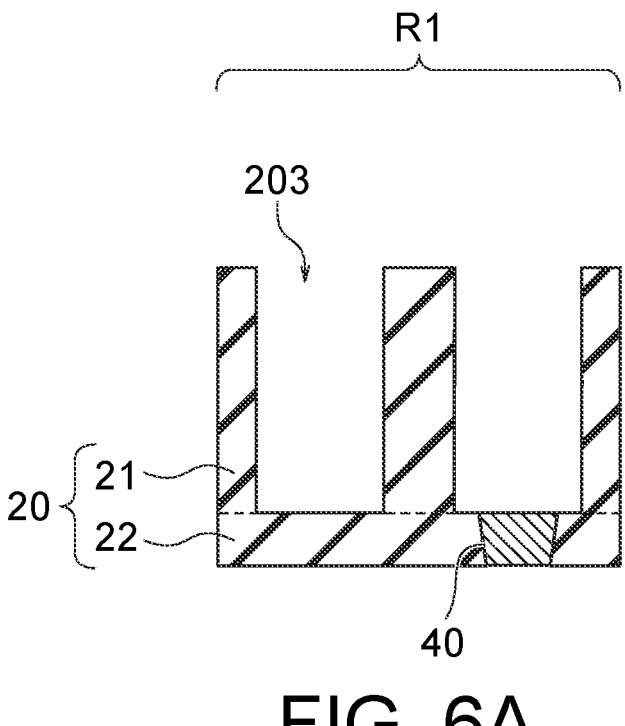
FIG. 6A is a cross-sectional view showing an example of a manufacturing method of the semiconductor device according to the comparative example.

First, as shown in FIG. 6A, recesses 203 are formed in the insulator layer 21. The width of each recess 203 is substantially the same as the width W1 of each wire 11.

Figure 6B:
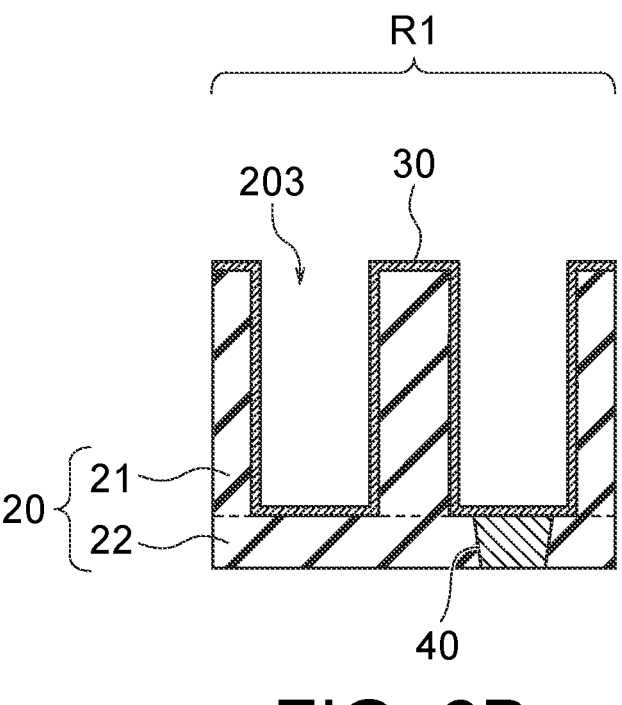
FIG. 6B is a cross-sectional view showing the example of the manufacturing method of the semiconductor device, following FIG. 6A.

Next, as shown in FIG. 6B, the barrier metal film 30 is formed on the insulator layer 21 and in the recesses 203.

Figure 6C:
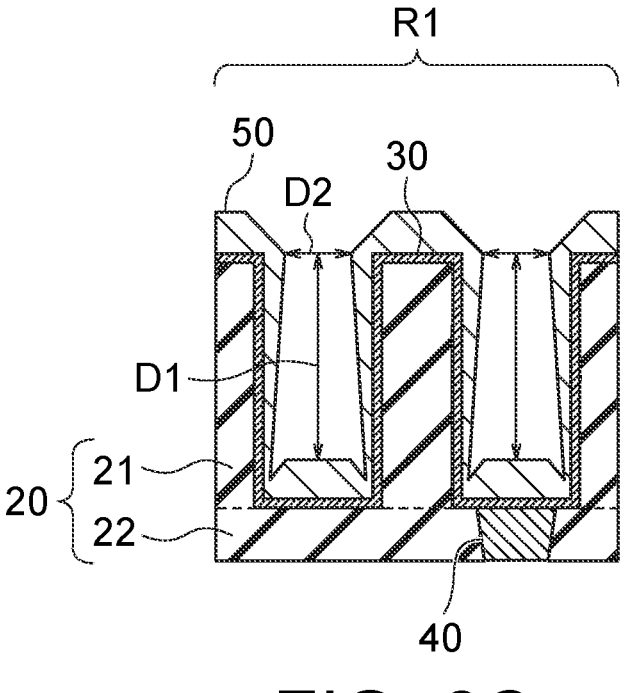
FIG. 6C is a cross-sectional view showing the example of the manufacturing method of the semiconductor device, following FIG. 6B.

Then, as shown in FIG. 6C, a seed layer of the electrically conductive material 50 is formed in the inside of the recesses 203. The seed layer is formed by sputtering, for example.

The distance D1 is a distance from the upper surface of the electrically conductive material 50 formed in the bottom of the recess 203 to the opening portion of the recess 203 (bottom-up distance). The distance D2 is a distance of the electrically conductive material 50, which is formed at the opening portion of the recess 203, across this opening. In the example shown in FIG. 6C, the distance D1 is larger than the distance D2 as compared with FIG. 2C; therefore, the difficulty in embedding is higher.

Figure 6D:
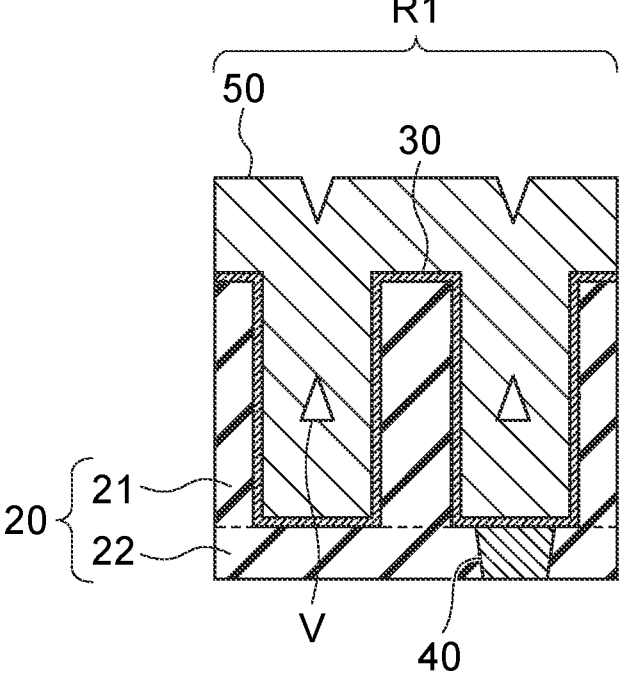
FIG. 6D is a cross-sectional view showing the example of the manufacturing method of the semiconductor device, following FIG. 6C.

As shown in FIG. 6D, the electrically conductive material 50 is formed in the inside of the recesses 203 to embed the electrically conductive material 50 in the recesses 203. The electrically conductive material 50 is formed by plating, for example. The wiring member is formed in each recess 203. Then, the wires 11 are formed by polishing the insulator layer 21 and the electrically conductive material 50 by CMP or the like.

From the relationship between the distance D1 and the distance D2 shown in FIG. 6C, voids V are likely to be generated as shown in FIG. 6D.

Now, the manufacturing flow of forming the recesses 203 will be described, hereinafter.

FIG. 7A to FIG. 7D are cross-sectional views each showing an example of the manufacturing method of the semiconductor device according to the comparative example.

Figure 7A:
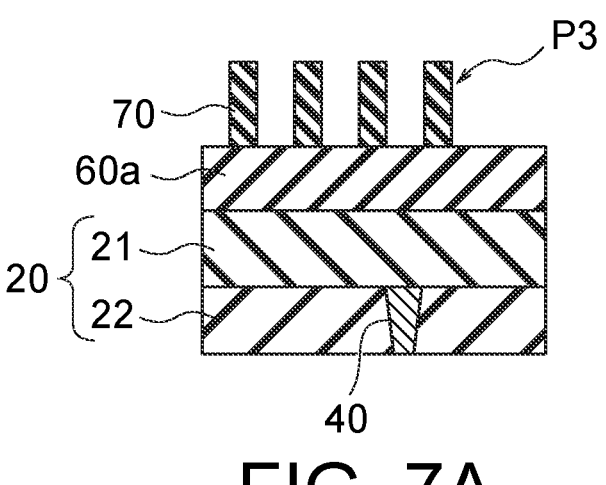
FIG. 7A is a cross-sectional view showing an example of the manufacturing method of the semiconductor device according to the comparative example.

First, as shown in FIG. 7A, a mask material 60a is formed on the insulator layer 21 to form a mask material 70 in a pattern P3.

For example, amorphous silicon may be used as the material of the mask material 60a.

Figure 7B:
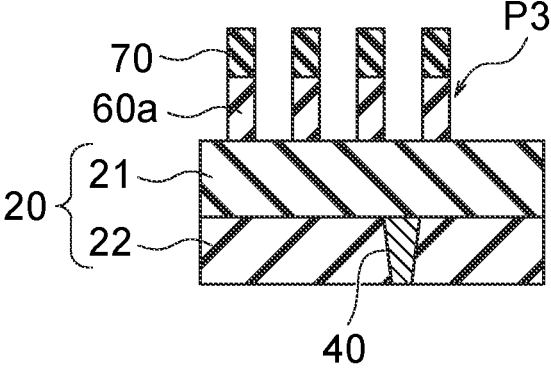
FIG. 7B is a cross-sectional view showing the example of the manufacturing method of the semiconductor device, following FIG. 7A.

As shown in FIG. 7B, the mask material 60a is processed by using the mask material 70 in the pattern P3 as a mask. Each interval of the mask material 60a in the pattern P3 corresponds to the width of each recess 203.

Figure 7C:
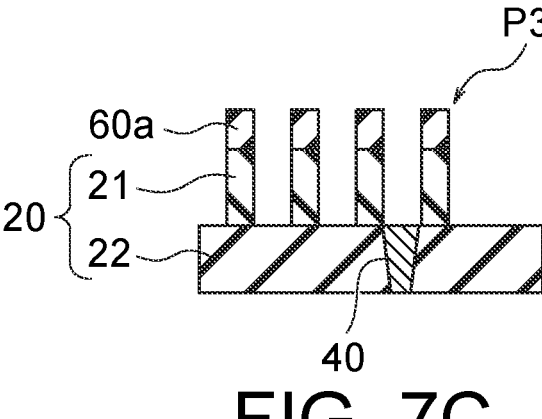
FIG. 7C is a cross-sectional view showing the example of the manufacturing method of the semiconductor device, following FIG. 7B.

Next, as shown in FIG. 7C, the insulator layer 21 is processed by using the mask material 60a in the pattern P3 as a mask. As a result, the recesses 203 are formed.

Figure 7D:
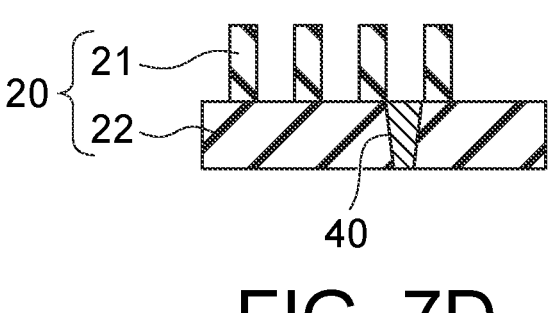
FIG. 7D is a cross-sectional view showing the example of the manufacturing method of the semiconductor device, following FIG. 7C.

Then, as shown in FIG. 7D, the mask material 60a is removed. Therefore, the process shown in FIG. 7D corresponds to the process shown in FIG. 6A. Subsequently, the processes shown in FIG. 6B to FIG. 6D are performed.

In the comparative example, the recesses 203 each having substantially the same width from the upper end to the lower end thereof are formed without changing the width of the mask material 60a during the processing of the insulator layer 21. In this case, due to the relationship between the distance D1 and the distance D2 shown in FIG. 6C, the voids V are likely to be generated in the inside of the wires 11 with a dense pitch.

In the meantime, in the first embodiment, by changing the width of the mask material 60 during the processing of the insulator layer 21, the recesses 201 each having a width larger than that of each of the recesses 202 can be formed on the recesses 202. Accordingly, it is possible to set the distance D1 with respect to the distance D2 shown in FIG. 2C to be smaller. As a result, the embedding can be facilitated, and for example, the voids V can be reduced. Accordingly, the embedding can be performed more appropriately. Further, due to the recesses 201, 202 having different widths, the wires 12 include the wiring members 121, 122 with different widths, and the side surfaces 12s of the wires 12 are provided with the steps 123.

Second Embodiment

FIG. 8A to FIG. 8E are cross-sectional views each showing an example of the manufacturing method of a semiconductor device according to the second embodiment. The second embodiment is different from the first embodiment in that the width of the mask material is reduced during the processing of the insulator layer 20.

Figure 8A:
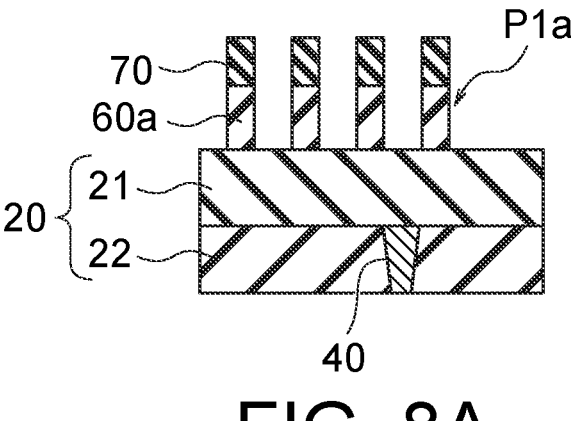
FIG. 8A is a cross-sectional view showing an example of the manufacturing method of the semiconductor device according to the first embodiment.

First, as shown in FIG. 8A, a pattern P1a is formed in the mask material 60a. The mask material 60a is processed by RIE, for example. Each interval of the mask material 60a in the pattern P1a corresponds to the width of each recess 202.

For example, amorphous silicon may be used as the material of the mask material 60a.

Figure 8B:
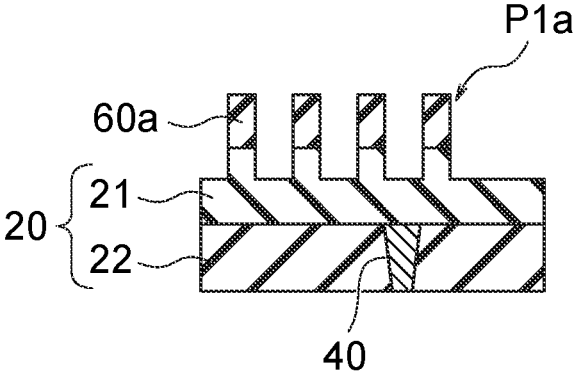
FIG. 8B is a cross-sectional view showing the example of the manufacturing method of the semiconductor device, following FIG. 8A.

As shown in FIG. 8B, the upper portion of the insulator layer 21 is processed by using the mask material 60a in the pattern P1a as a mask. That is, the insulator layer 21 is processed halfway. The insulator layer 21 is processed by RIE, for example.

Figure 8C:
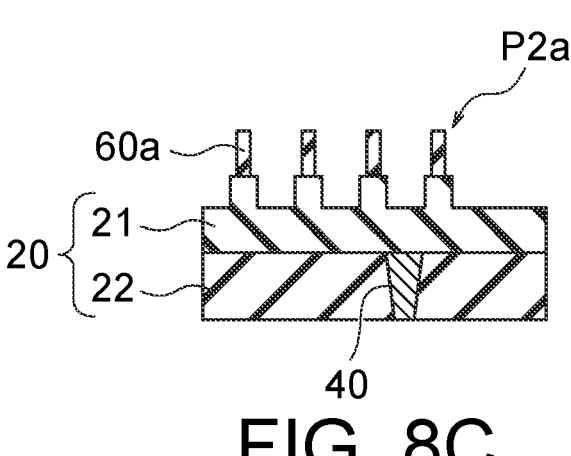
FIG. 8C is a cross-sectional view showing the example of the manufacturing method of the semiconductor device, following FIG. 8B.

As shown in FIG. 8C, the mask material 60a is slimmed. More specifically, the width of the mask material 60a is reduced by selectively etching the mask material 60a. Each interval of the mask material 60a in the pattern P2a corresponds to the width of each recess 201. The slimming of the mask material 60a is performed, for example, by selectively wet-etching the insulator layer 20. The slimming of the mask material 60a is performed by wet-etching using TMY, for example, when the material of the mask material 60a is amorphous silicon.

Figure 8D:
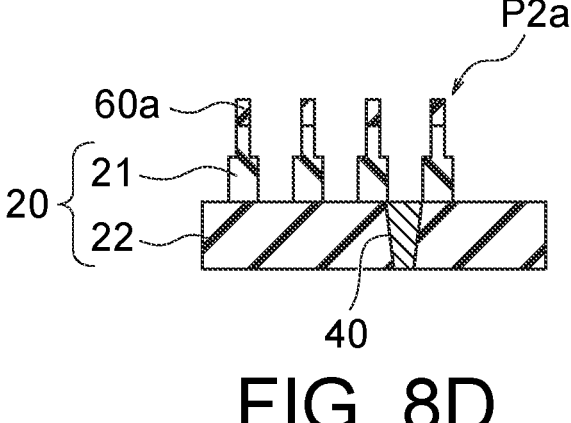
FIG. 8D is a cross-sectional view showing the example of the manufacturing method of the semiconductor device, following FIG. 8C.

As shown in FIG. 8D, the recesses 201, 202 are formed in the insulator layer 21 by processing the insulator layer 21 using the mask material 60a in the pattern P2a as a mask. The insulator layer 21 is processed by RIE, for example.

Figure 8E:
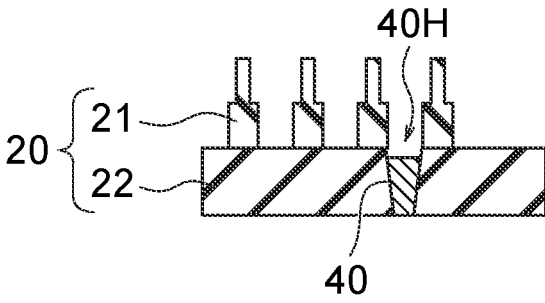
FIG. 8E is a cross-sectional view showing the example of the manufacturing method of the semiconductor device, following FIG. 8D.

As shown in FIG. 8E, the mask material 60a is removed and the columnar electrode 40 is partially removed as well. As a result, the upper end portion of the columnar electrode 40 is dented (recessed) such that the upper portion of the hole 40H opens. The removal of the mask material 60a is performed by wet-etching using TMY. TMY is contained in an etching solution and thereby the columnar electrode 40 is partially removed. The process shown in FIG. 8E corresponds to FIG. 2A. Subsequently, the processes shown in FIG. 2B to FIG. 2D are performed.

The reduction in width of the mask material 60a is performed by slimming the mask material 60a. Accordingly, as in the first embodiment, the recesses 201, 202 can be formed without an additional lithography process.

As in the second embodiment, the width of the mask material 60a may be reduced during the processing of the insulator layer 20. The semiconductor device according to the second embodiment can obtain the same effects as those of the first embodiment.

In the second embodiment, the width of the mask material 60a in the pattern P1a shown in FIG. 8B is larger than the width of the mask material 60 in the pattern P1 shown in FIG. 4A in the first embodiment. Therefore, the mask material 60a is less likely to fall down than the mask material 60. In addition, usually, when a mask material in a thin pattern is formed, an expensive exposure apparatus might be required. In the second embodiment, it is possible to use an exposure apparatus having difficulties in exposing a thin pattern, as compared with the first embodiment.

Third Embodiment

Figure 9:
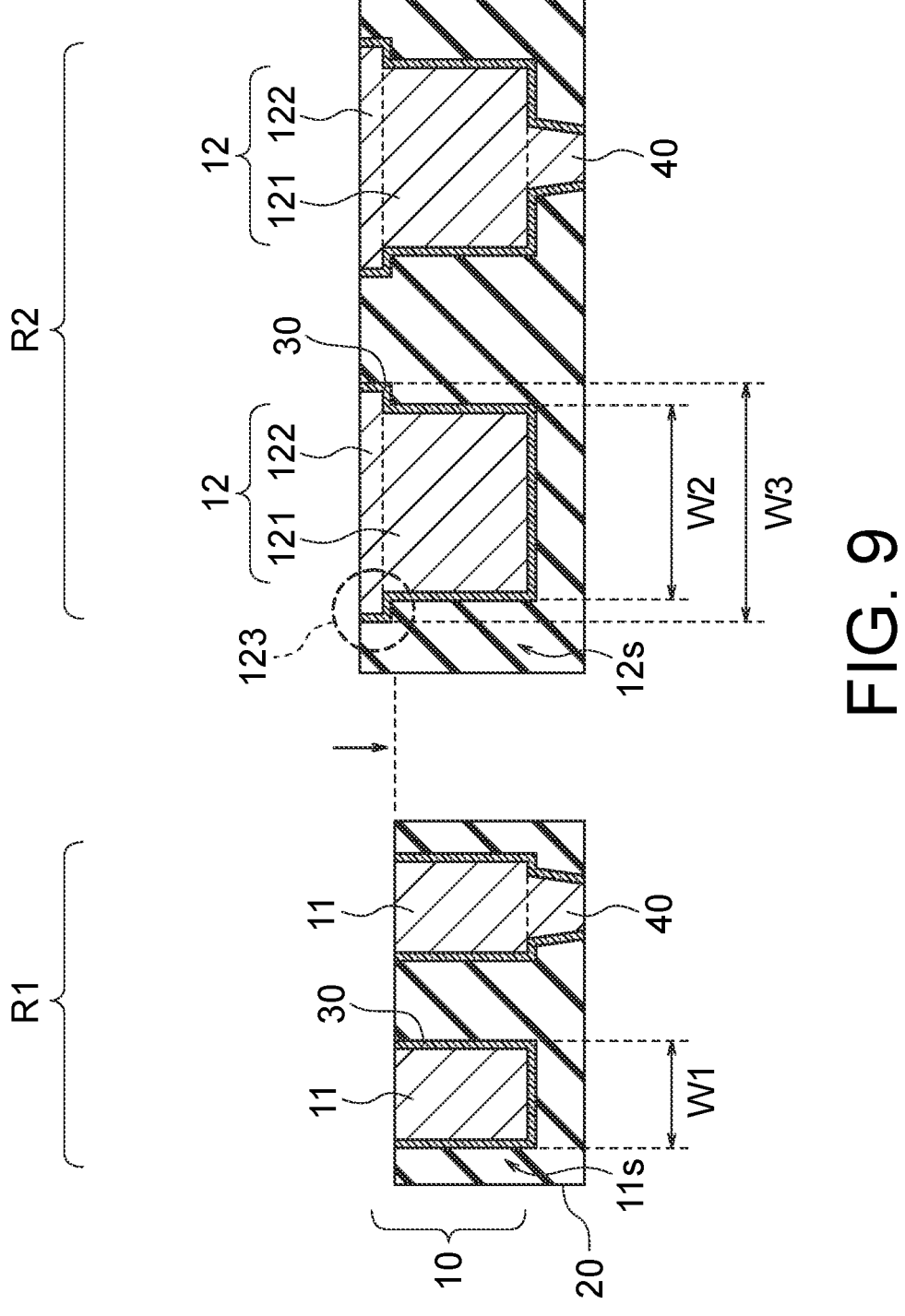
FIG. 9 is a cross-sectional view showing an example of a configuration of a semiconductor device according to the third embodiment.

FIG. 9 is a cross-sectional view showing an example of the configuration of a semiconductor device according to the third embodiment. The third embodiment is different from the first embodiment in that the wires 11, 12 are integrally formed with the columnar electrodes 40. That is, the wires 11, 12 and the columnar electrodes 40 according to the first embodiment are formed by a single damascene method, whereas the wires 11, 12 and the columnar electrodes 40 according to the third embodiment are formed by a dual damascene method.

As shown in FIG. 9, the wires 11, 12 and the columnar electrodes 40 are integrally provided. Further, no barrier metal film 30 is provided between the wires 11, 12 and the columnar electrodes 40.

The other configurations of the semiconductor device according to the third embodiment are the same as the corresponding configurations of the semiconductor device according to the first embodiment; therefore, detailed description thereof will be omitted.

Figure 10:
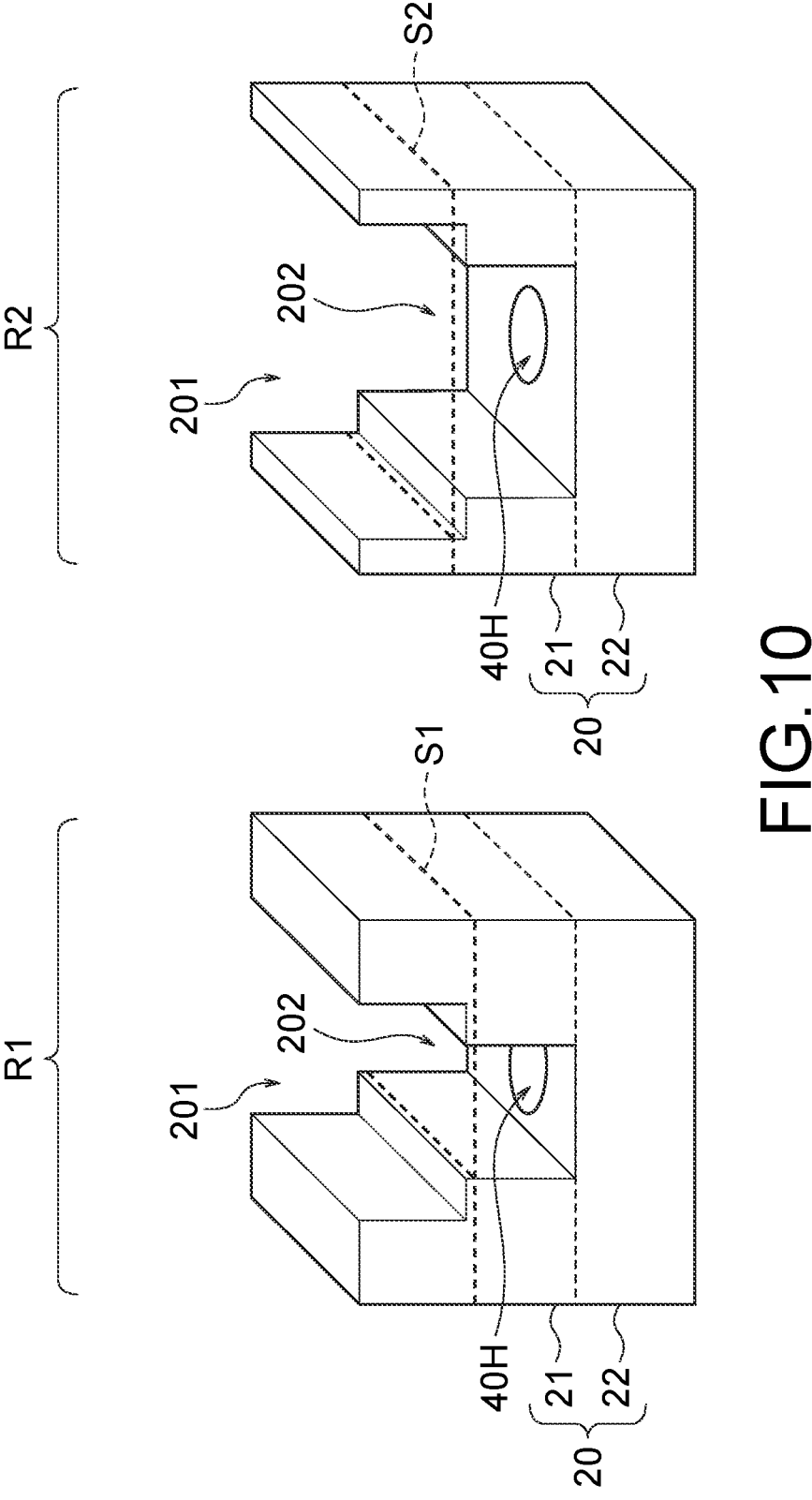
FIG. 10 is a perspective view showing an example of polishing positions according to the third embodiment.

FIG. 10 is a perspective view showing an example of polishing positions according to the third embodiment.

As shown in FIG. 10, holes 40H communicate with corresponding recesses 202.

As with FIG. 3 in the first embodiment, in the region R1, the polished surface S1 is located deeper than the recess 201 and crosses the recess 202. Therefore, in the region R1, the wiring member formed in the recess 201 is completely removed by polishing, and the wiring member formed in the recess 202 remains as the wire 11. As with FIG. 3, in the region R2, the polished surface S2 crosses the recess 201. Therefore, in the region R2, as shown in FIG. 9, the wiring member 121, and a part of the wiring member 122 formed in the recess 201 remain as the wire 12.

As in the third embodiment, the wires 11, 12 may be integrally formed with the columnar electrodes 40. The semiconductor device according to the third embodiment can obtain the same effects as those of the first embodiment.

Fourth Embodiment

Figure 11:
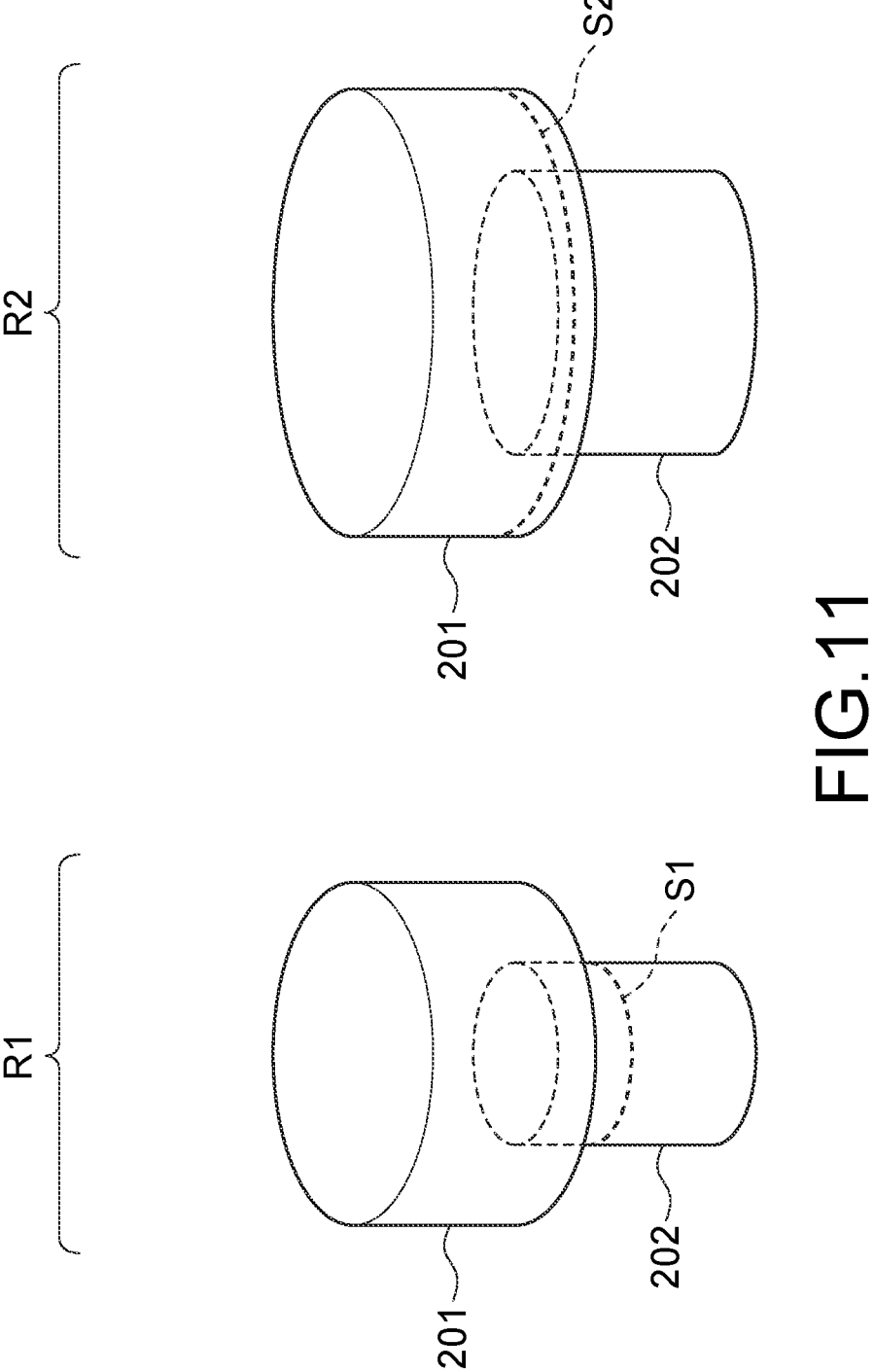
FIG. 11 is a perspective view showing an example of polishing positions according to the fourth embodiment.

FIG. 11 is a perspective view showing an example of polishing positions according to the fourth embodiment. FIG. 11 shows the shapes of the recesses 201, 202. It should be noted that the illustration of the hole 40H which is exposed by removing a part of the columnar electrode 40 is omitted. The left side of FIG. 11 shows the polished surface S1 in the region R1. The right side of FIG. 11 shows the polished surface S2 in the region R2. As described above, in the polished surfaces S1, S2, the positions (heights) of the polished surfaces are different depending on the widths of the wires 11, 12, that is, the widths of the respective recesses 202.

The fourth embodiment is different from the first embodiment in that pads 11a, 12a are provided in place of the wires 11, 12 extending in a direction substantially parallel to the wiring layer 10.

As with FIG. 3 in the first embodiment, in the region R1, the polished surface S1 is located deeper than the recess 201 and crosses the recess 202. Therefore, in the region R1, the pad member formed in the recess 201 is completely removed by polishing, and the pad member formed in the recess 202 remains as a pad 11a corresponding to the wire 11. As with FIG. 3, in the region R2, the polished surface S2 crosses the recess 201. Therefore, in the region R2, a pad member 121a corresponding to the wiring member 121 and a pad member 122a corresponding to the wiring member 122 remain as pads 12a corresponding to the wires 12, as shown in FIG. 1.

Since the other configurations of the semiconductor device according to the fourth embodiment are the same as the corresponding configuration of the semiconductor device according to the first embodiment, detailed description thereof will be omitted.

As in the fourth embodiment, the pads 11a, 12a may be provided instead of the wires 11, 12. The semiconductor device according to the fourth embodiment can obtain the same effects as those of the first embodiment.

Fifth Embodiment

Figure 12:
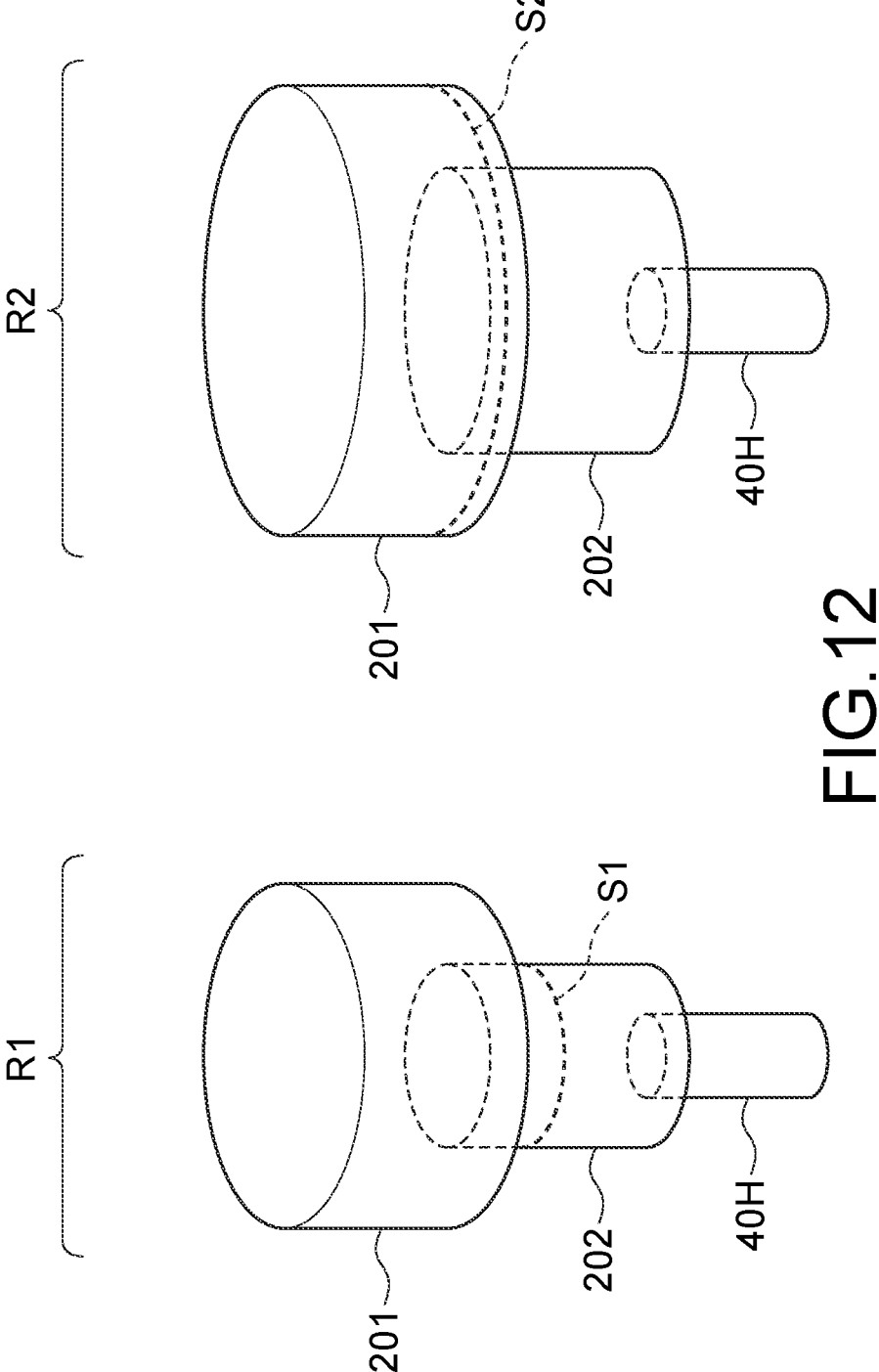
FIG. 12 is a perspective view showing an example of polishing positions according to the fifth embodiment.

FIG. 12 is a perspective view showing an example of the polishing positions according to the fifth embodiment. The fifth embodiment is different from the fourth embodiment in that the pads 11a, 12a are integrally formed with the columnar electrodes 40. That is, the pads 11a, 12a and the columnar electrodes 40 according to the fourth embodiment are formed by the single damascene method, whereas the pads 11a, 12a and the columnar electrodes 40 according to the fifth embodiment are formed by the dual damascene method. Therefore, the fifth embodiment is a combination of the third embodiment and the fourth embodiment.

As in the fifth embodiment, the pads 11a, 12a may be integrally formed with the columnar electrodes 40. The semiconductor device according to the fifth embodiment can obtain the same effects as those of the fourth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising a wiring layer including a plurality of wires, the wires including:

first wires extending in an extending direction and each having a first width, the first width being a distance between side surfaces of the first wires; and second wires arranged at wider intervals than intervals of the first wires, each of the second wires including:

a first wiring member having a second width larger than the first width; and a second wiring member provided on the first wiring member and having a third width larger than the second width, wherein the wiring layer in which the first wires are provided is the same as the wiring layer in which the second wires are provided, a side surface of the second wire in a direction substantially perpendicular to both of an extending direction of the second wires and a direction of the second width has a step at a boundary between the first wiring member and the second wiring member, the step being in accordance with a difference between the second width and the third width, and a lower part of the step is substantially parallel to an upper surface of the second wiring member.

2. The semiconductor device according to claim 1, further comprising a columnar electrode that is electrically connected to a bottom of the first wire or the second wire and extends in a direction substantially perpendicular to both of the extending direction of the second wires and the direction of the second width, wherein the bottom of the first wire or the second wire in contact with the columnar electrode protrudes toward the columnar electrode.

3. The semiconductor device according to claim 2, wherein a height of a connecting surface between the first wire or the second wire and the columnar electrode, the height being in a direction substantially perpendicular to both of the extending direction of the second wires and the direction of the second width, is lower than a height of the bottom of the first wire or the second wire not in contact with the columnar electrode.

4. The semiconductor device according to claim 1, wherein a height of the first wire in a direction substantially perpendicular to both of the extending direction of the second wires and the direction of the second width is lower than a height of the first wiring member.

5. The semiconductor device according to claim 1, wherein a side surface of the first wire in the direction substantially perpendicular to both of the extending direction of the second wires and the direction of the second width has no step.

\*   \*   \*   \*   \*